United States Patent [19]

Berthet et al.

[11] 4,281,516

[45] Aug. 4, 1981

[54] THERMOELECTRIC HEAT EXCHANGER INCLUDING A LIQUID FLOW CIRCUIT

[75] Inventors: Michel Berthet, Gif-sur-Yvette; Jean-Claude Kermarrec, Vélizy-Villacoublay; Robert Ravelet, Palaiseau, all of France

[73] Assignee: Compagnie Europeenne pour l'Equipement Menager "CEPEM", Paris, France

[21] Appl. No.: 133,697

[22] Filed: Mar. 25, 1980

[30] Foreign Application Priority Data

Mar. 26, 1979 [FR] France ................... 79 07518

[51] Int. Cl.³ ............................................. F25B 21/02
[52] U.S. Cl. ........................................................ 62/3
[58] Field of Search ................................................ 62/3

[56] References Cited

U.S. PATENT DOCUMENTS

| | | | |
|---|---|---|---|
| 2,729,949 | 1/1956 | Lindenblad | 62/3 |
| 3,148,511 | 9/1964 | Gable | 62/3 |
| 3,165,900 | 1/1965 | Huntington | 62/3 |
| 3,178,895 | 4/1965 | Mole et al. | 62/3 |
| 3,196,620 | 7/1965 | Elfuing et al. | 62/3 |
| 3,197,342 | 7/1965 | Neild, Jr. | 62/3 |
| 3,366,164 | 1/1968 | Newton | 62/3 X |
| 3,370,434 | 2/1968 | Mole | 62/3 |
| 3,626,704 | 12/1971 | Coe, Jr. | 62/3 |

FOREIGN PATENT DOCUMENTS 1430425 1/1966 France .

*Primary Examiner*—Lloyd L. King
*Attorney, Agent, or Firm*—Sughrue, Mion, Zinn, Macpeak and Seas

[57] ABSTRACT

The invention relates to a thermoelectric heat exchanger assembly including a liquid flow circuit. In a heat pump some of whose thermoelements (20,22) are disposed in a thermopile (P1), one of the heat exchange fluids is liquid and flows through the successive stages of the thermopile via a continuous metal tube (10) which has electrical resistance and is curved in a U configuration at each stage so as to increase the heat exchange area and to facilitate assembly. Application to domestic heating.

6 Claims, 9 Drawing Figures

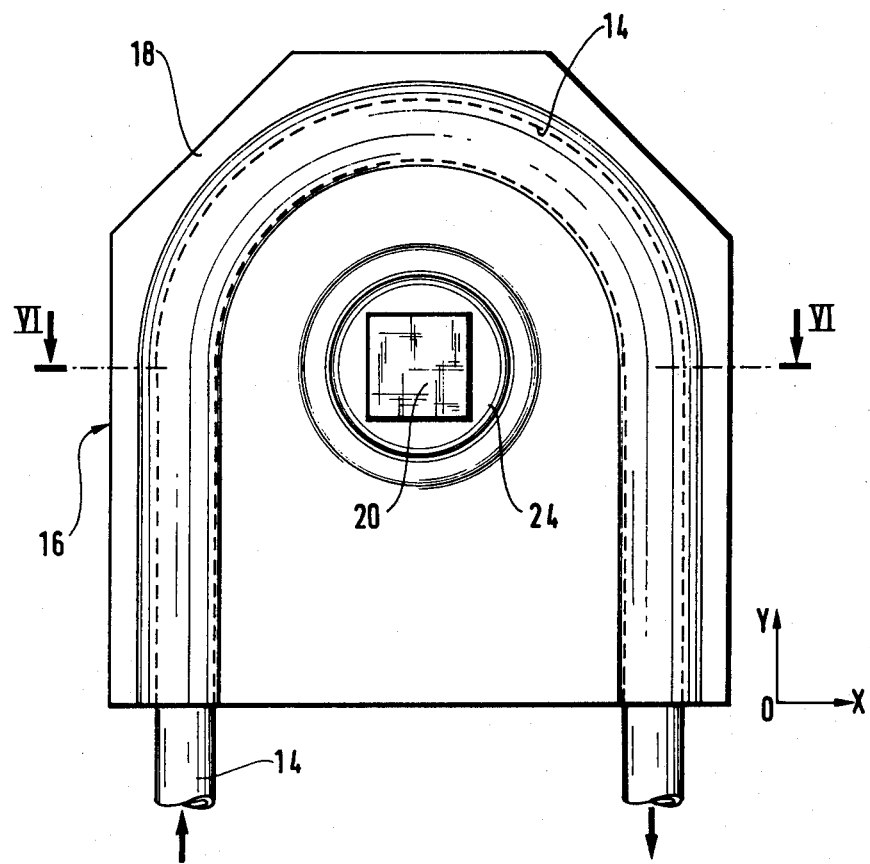
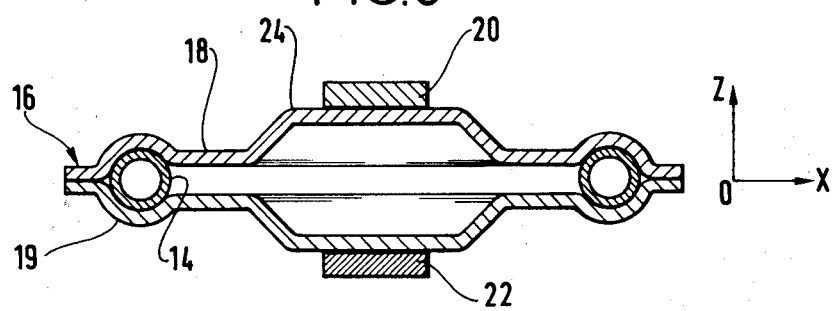

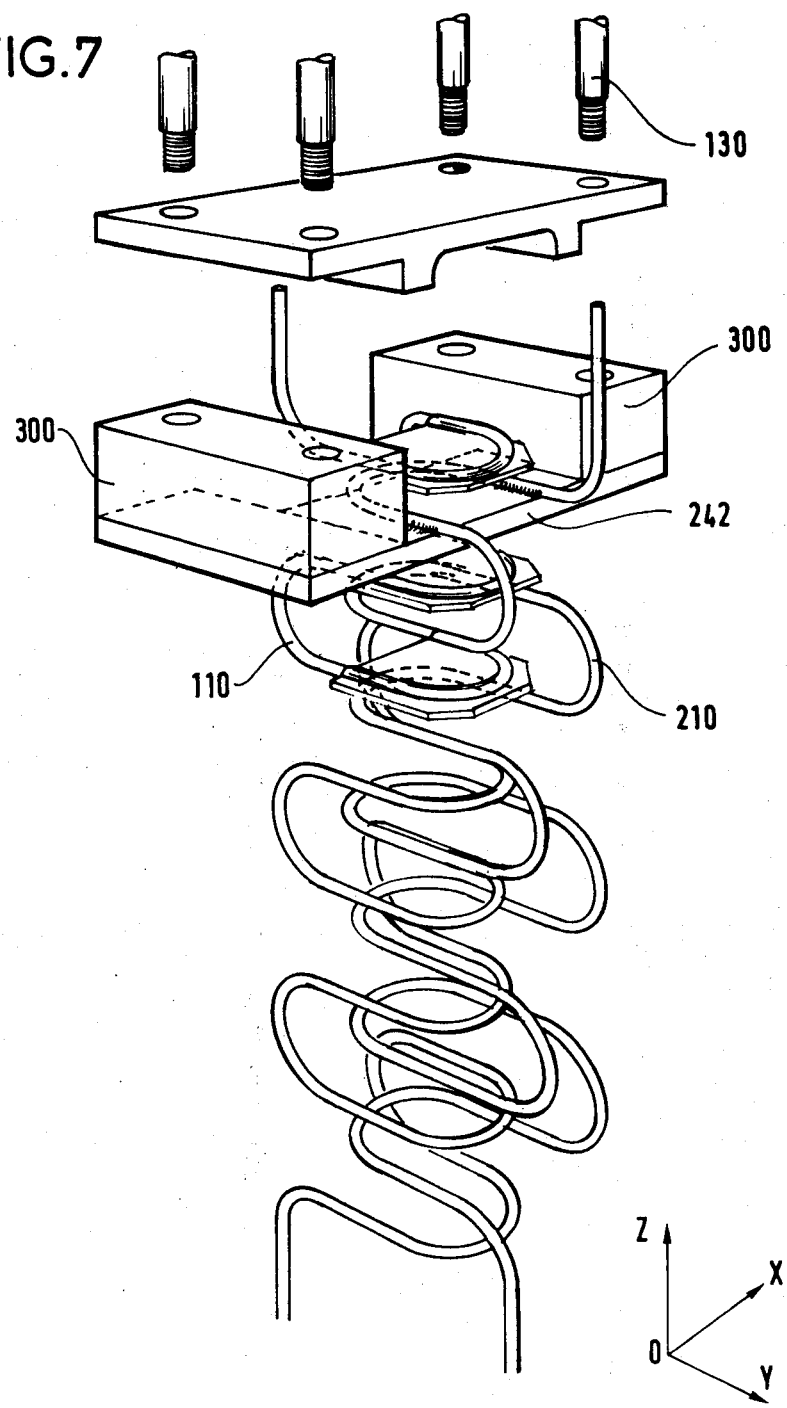

THERMOELECTRIC HEAT EXCHANGER INCLUDING A LIQUID FLOW CIRCUIT

The present invention relates to a thermoelectric heat exchanger including a liquid flow circuit.

BACKGROUND

A thermoelectric heat exchanger assembly is a device based on the thermocouple. An elementary thermocouple comprises an electrical circuit including two dissimilar conductors connected in series. When a direct current (DC) is passed through the circuit, heat is pumped from one of the electrical connections between the dissimilar conductors to the other, giving rise to a hot junction and a cold junction. The converse effect also occurs, i.e. heating one junction and cooling the other will generate a flow of DC in the electric circuit. Reversing the direction of DC flow interchanges the hot and cold junctions.

The effect of an elementary thermocouple is small and a practical thermoelectric heat exchanger assembly requires a large number of elementary thermocouples to be electrically connected in series. This gives rise to an alternating series of hot junctions and cold junctions. A physical structure is thus required to put each cold junction in thermal contact with a cold fluid and likewise to put each hot junction in thermal contact with a hot fluid. These structures are referred to respectively as a hot exchanger and as a cold exchanger. In both cases thermal contact must be achieved by the exchangers without electrically shorting the series connection of elementary thermocouples.

Generally speaking, the dissimilar conductors which give rise to the thermoelectric effect are constituted by suitable alternating P type and N type semiconductor material, e.g. bismuth telluride, and are referred to herein as P type thermoelements and N type thermoelements. P type thermoelements transfer heat in the same direction as the flow of electric current and N type thermoelements transfer heat in the opposite direction. The thermoelements are electrically interconnected by heat conductors which thereby constitute the hot or cold junctions and form parts of the respective exchangers. Although the heat conductors thus form third (and possibly fourth) dissimilar types of conductor in the series connection of thermocouples, their contribution to, or interference with, the thermoelectric effect is minimal.

The above outline recalls the well-known essentials of thermoelectric heat exchanger assembly. The present invention applies more particularly but not exclusively to the type of thermoelectric heat exchanger assembly which keeps the heat conductors at different temperatures, the thermoelements being fed with DC to maintain a temperature difference between the heat conductors. Such a device is called a "heat pump" and can also be used for air conditioning by heating or cooling a fluid by means of heat in the ambient atmosphere.

It has already been proposed to manufacture thermoelectric heat exchanger assemblies which include thermopiles with hot and cold heat exchangers which are electrically conductive and separated alternately by P type and N type thermoelements, the electric current flowing in the pile direction, e.g. vertically. These vertical thermopiles are disposed side by side so as to constitute an assembly with a parallelepipedical appearance in which the small plates or pellets which constitute the thermoelements are disposed in a succession of horizontal planes and the heat exchangers are disposed in intermediate horizontal planes. One of the heat exchanger fluids flows horizontally through each heat exchanger, the cold fluid flowing in one direction and the hot fluid flowing in the other.

The mechanical structure is designed to conciliate the sealing requirements for the fluid flow circuits with differential thermal expansion. It is particularly tricky to produce such a structure since known bismuth telluride based thermoelements are extremely fragile.

Such a structure is described for example in U.S. Pat. No. 3,626,704 (Coe).

Said structure has various disadvantages, in particular when at least one of the fluids, hot or cold, is liquid. A liquid flow circuit can be constituted by a tube which passes through the successive liquid heat exchangers of the thermopile in series, going alternately in one direction and in the other, e.g. in horizontal directions OY and YO, with bent connections situated alternately on one side and on the other of the thermopile. A liquid heat exchanger is a heat exchanger which takes heat from or gives it to a liquid. Two disadvantages then arise. Firstly, if the liquid flow circuit is preformed with a suitably curved tube to impart thereto a zig-zag shape, then the other components of the thermopile, in particular the thermoelements, must be assembled from both sides of the structure which is constituted by said zig-zag tube. This somewhat complicates assembly and increases the cost price. If the liquid flow circuit is not preformed, but rather is constituted by a succession of lengths connected together by glueing or welding after the thermopile has been constituted, there tend to be sealing problems.

A second disadvantage arises when several thermopiles of the above-mentioned type are disposed side by side in a row in the direction OY. Indeed, precautions must then be taken to prevent the bent connections of two neighbouring thermopiles from touching each other, since this would cause electrical short circuits if, as is generally desirable, the successive thermopiles are fed electrically in series. These precautions result either in increasing the distance between the successive thermopiles, i.e. increasing the bulk of the device, or else in complicating assembly, i.e. increasing the cost price.

A further difficulty can arise from the fact that if the tube which constitutes the liquid flow circuit has a circular cross-section of small diameter, the heat exchange area between the water and the tube is too small. If the diameter is increased, this increases the bulk of the thermopile. If the shape of the tube is flattened, its cost price increases and it does not withstand crushing very well when the thermopile is subjected to compression as is desirable to prevent breakage of the thermoelements during handling or during differential thermal expansion.

Further, U.S. Pat. No. 3,196,620 (Ser. No. 343,678, Elfving) describes a thermoelectric heat exchanger whose liquid flow circuit includes straight tubes which pass in series through several thermopiles in the same row. Each stage of each thermopile includes a thermoelement e.g. a P type thermoelement, a (cold) heat exchanger, an (N type) thermoelement and a (hot) heat exchanger. At the end of the row, the straight tube is connected by a bent connection length to another straight tube which passes in series through the thermopiles of another row. It is difficult to assemble such a heat exchanger and the deformation of each thermopile is transmitted to the neighbouring thermopiles. This may cause the thermoelements to break.

AIM OF THE INVENTION

The present invention aims to provide a thermoelectric heat exchanger assembly which includes a liquid flow circuit that can easily be assembled, is not very bulky and provides good heat exchange.

SUMMARY OF THE INVENTION

The present invention provides a thermoelectric heat exchanger assembly with a liquid flow circuit, said heat exchanger assembly including:

firstly at least one thermopile of electrically non-insulative units which are in good electrical and thermal contact and are superposed in a stack direction OZ, the thermopile being formed by a plurality of stages each of which includes the following four components:

a thermoelement of a first conductivity type;

a heat conductor of a first type;

a thermoelement of a second conductivity type, opposite to the first; and a heat conductor of a second type;

said thermoelectric heat exchanger assembly also including electric connections at both ends of the thermopile to make an electric current pass through these components in series;

a first fluid flow circuit for the circulation of a first heat exchange fluid;

a second fluid flow circuit for the circulation of a second heat exchange fluid said second fluid being a liquid, said circuit being constituted by a pipe which passes in series through the heat conductors of the second type in the successive stages of the thermopile, the lengths of said pipe which pass through said conductors being heat exchange lengths and being interconnected in series by connection lengths which extend between two successive stages of the thermopile; and heat exchangers of a first type and heat exchangers of a second type to exchange heat between the thermopile and the fluids which circulate in said first circuit and in said second circuit respectively, the heat exchangers of the first type including the heat conductors of the first type, the heat exchangers of the second type being constituted by said heat exchange lengths and the heat conductors of the second type, each heat exchange length being curved at each stage of the thermopile so that it enters the heat conductor and leaves it through the same face of a thermopile, the direction YO in which each heat exchange length leaves the thermopile being substantially opposite to the direction OY in which the heat exchange length enters the thermopile thereby facilitating assembly of the thermopile.

BRIEF DESCRIPTION OF THE DRAWINGS

A description of how the invention may be used is given hereinbelow by way of a non-limiting example and with reference to the accompanying schematic figures. It must be understood that without going beyond the scope of the invention the components described and illustrated can be replaced by other components which fulfil the same technical functions. When the same component is illustrated in several figures it bears the same reference symbol in all of them. In the drawings:

FIG. 5 is a plan view of a water type heat exchanger assembly in accordance with the invention;

FIG. 6 is a cross-section view of the heat exchanger assembly illustrated in FIG. 5 through a plane VI—VI;

FIG. 7 is an exploded perspective view of the main parts of a heat exchanger assembly in accordance with a second embodiment of the invention, said heat exchanger constituting a water-to-water heat pump and including a thermopile disposed in said direction OZ.

DETAILED DESCRIPTION

Figure 1:
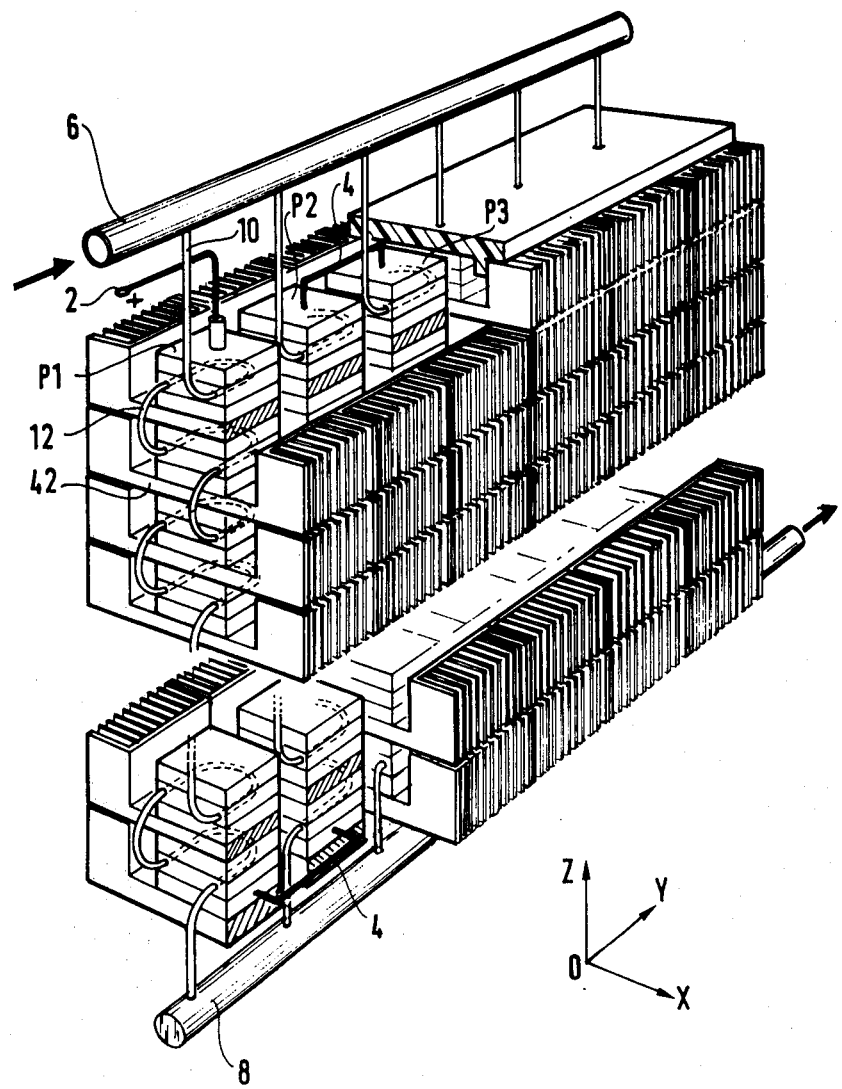
FIG. 1 is a simplified general view in perspective and in partial section of the main parts of a thermoelectric heat exchanger assembly in a first embodiment of the invention, the illustrated heat exchanger constituting a water-to-air heat pump and including a thermopile which is disposed in a vertical direction OZ.

In the first embodiment of the heat exchanger assembly invention, heat is exchanged between a first fluid which is air and a second fluid which is water. Air constitutes the hot fluid. It is heated by extracting heat from the cold source which is constituted by water. In other words, the apparatus constitutes a water-to-air heat pump which has a row of thermopiles such as P1, P2, P3, etc. each constituted by a stack of thermoelements and of heat conductors which form parts of heat exchangers. The heat exchangers and their respective heat conductors are of different types: a first type and a second type. In the present embodiment the first type uses air as its heat exchange fluid while the second type uses water. Each thermopile is stacked in a vertical direction OZ with the row extending in a horizontal direction OY which is considered for example as going from front to back. Simply with a view to explaining more easily the shapes and positions of the various components and in accordance with what is illustrated in FIG. 1, it may be considered to a first approximation that the shape of each thermopile is a vertical block of square cross-section, two sides of the square being parallel to OY while the other two are parallel to a horizontal direction OX perpendicular to OY, it being considered, for example, that line OX goes from right to left. In the figure, each thermopile has four vertical surfaces: front, right, back, and left. In actual fact, in accordance with what is shown in greater detail in the following figures, the components which make up the thermopile do not all have the same horizontal extent, the thermoelements being much smaller than the heat exchangers, the axis of the thermopile being a vertical line which passes through the centres of all the thermoelements of the thermopile. The air type heat exchangers are the widest. They each include a portion which is situated between the thermoelements, i.e. a portion inside the thermopile. Said portion constitutes a heat conductor of the previously mentioned first type.

Each stage of the thermopile includes: a heat conductor of the first type forming part of an air heat exchanger; a first, P or N, type of thermoelement; a heat conductor of the second type constituting part of a water heat exchanger and a thermoelement of a second type, N or P, opposite to the first.

Three circuits are connected to these thermopiles, namely, an electric circuit, and first and second fluid circuits which are an air circuit and a water circuit.

The electric circuit is intended to cause an electric current to pass through the thermoelements in the direction OZ, for example, in the case of even numbered thermopiles such as P2 and in the direction ZO in the case of odd numbered thermopiles such as P1 and P3. The thermopiles are connected in series and receive power from a pair of terminals 2, disposed near the appropriate ends of the end thermopiles of the row. Acceptable heat pump impedance can be obtained in such a series connection despite the low impedance of each thermopile. The thermopiles are interconnected by rods such as 4 disposed alternately at the top and at the bottom of the row.

Figure 4:
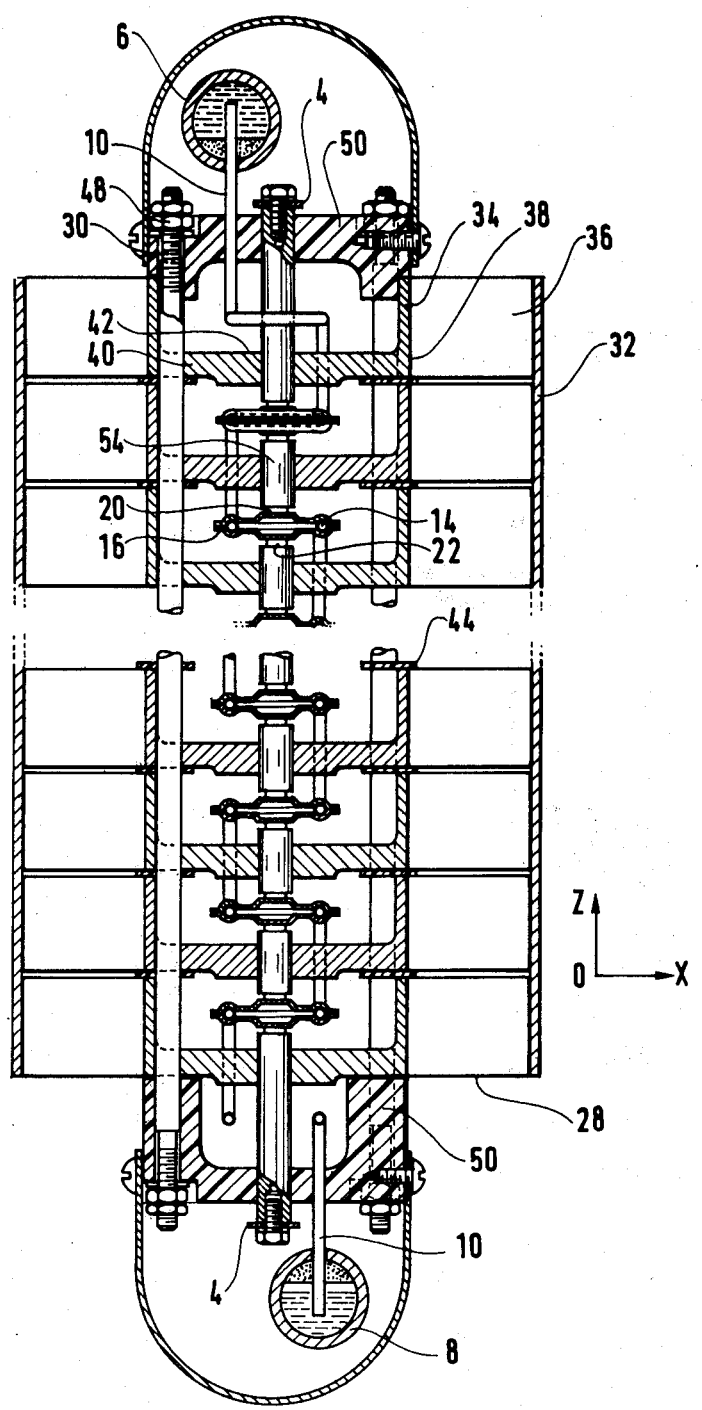
FIG. 4 illustrates the same heat exchanger assembly showing a cross-section through a vertical plane parallel to a horizontal direction OX which is perpendicular to OY.

In the row of thermopiles, the air circuit as a whole consists mainly of pairs of vertical air passages such as 28 (FIG. 4) in the form of symmetrical layers of air on either side of the row. It would evidently be possible, although in most cases less advantageous, to provide only one passage per thermopile, on one side thereof, or alternatively for the passages which correspond to the various thermopiles to be completely separated from one another.

Each passage such as 28 is delimited by two vertical walls which are parallel to the plane YOZ—a non-homogenous inner wall 34 whose composition is described below and an outer wall 32 which is preferably electrically insulative. It could also be delimited at the front and at the back by two plates parallel to the plane XOZ which are not illustrated.

The entire volume of the passage is occupied by a set of heat exchange units such as 36 constituted by vertical fins which provide a large heat exchange area with air, as is known. Each of these units forms a part of a heat exchanger which includes one of the air type heat conductors of the thermopile. Fin units succeed one another vertically up each thermopile and also succeed one another horizontally from front to back along the row of thermopiles. They are constituted by a metal which is a good heat conductor, such as aluminum, and are fixed to the non-homogenous inner wall 34 by welding. To prevent them from setting up short circuits, they are insulated from one another by insulating parts 44.

The said non-homogenous wall 34 includes lateral vertical flanges such as 38 raised at the ends 40 of horizontal webs such as 42. The flanges 38 are disposed to either side of a respective air type heat conductor 54 (FIGS. 2 and 4) and are in good thermal contact therewith. More particularly, the heat conductor 54 is in the form of a solid vertical cylinder which passes through the center of the horizontal web 42 and is bonded thereto. The flanges 38 are in the form of rectangular plates disposed in planes parallel to YOZ and having dimensions such that they occupy substantially the entire extent of the outer wall 32. To prevent electrical short-circuiting, thin insulating sheets such as 44 are disposed between the edges of the adjacent plates constituted by these flanges. The sheets are held in position on assembly by holes therein through which vertical tie rods 30 are inserted. These tie rods also pass through holes 46 in the ends 40 of the webs 42 to hold them in position and to press the flanges 38 vertically against one another. The tie rods are covered with insulating sheaths to prevent electrical short circuits.

There are four such tie rods around each thermopile. They are placed at the four corners of its square cross-section and their ends are threaded so that nuts 48 and insulating bearing plates 50 are able to compress the assembly effectively, assisted by the flanges 38 which therefore form a stack of compressed components. Said stack provides a rigid assembly keeping the thermoelements compressed.

The assembly formed by the web 42 and its two flanges 38 constitutes a single part 52 made of nickel-plated aluminium, for example. It may be considered that said part is formed by three plates, namely, two vertical plates parallel to the plane YOZ, i.e. the two flanges 38 and the horizontal web 42 which connects the two flanges together. Seen from the front, it is shaped like a channel-section bar but could also be shaped like a horizontal I beam. The flanges 38 extend towards the rear beyond the web 42 leaving an empty space between them which is partially occupied by the connecting lengths of a water pipe which will be described further on. Such a part performs two functions: firstly, it constitutes one stage of a support column formed by stacking similar parts and co-operating with the tie rods 30 to provide a rigid mechanical structure which is solid and easy to assemble, each stage of the column corresponding to a stage of the thermopile; and secondly, it co-operates with the heat exchanger units 36 to constitute an air type heat exchanger at each stage of the thermopile.

Contact between the thermoelements and the part 52 is provided by the air type heat conductors 54 which are constituted by solid cylinders made of the same material as said part 52 and disposed in orifices provided in the centre of the webs 42 and protruding thereabove and therebelow.

The thickness of the web 42 is, for example, 6 mm; its width along the direction OY is 50 mm and its length along the direction OX is 63 mm. The thickness of the flanges 38 is 2 mm; their height is 24 mm and their width is 50 mm.

Figure 2:
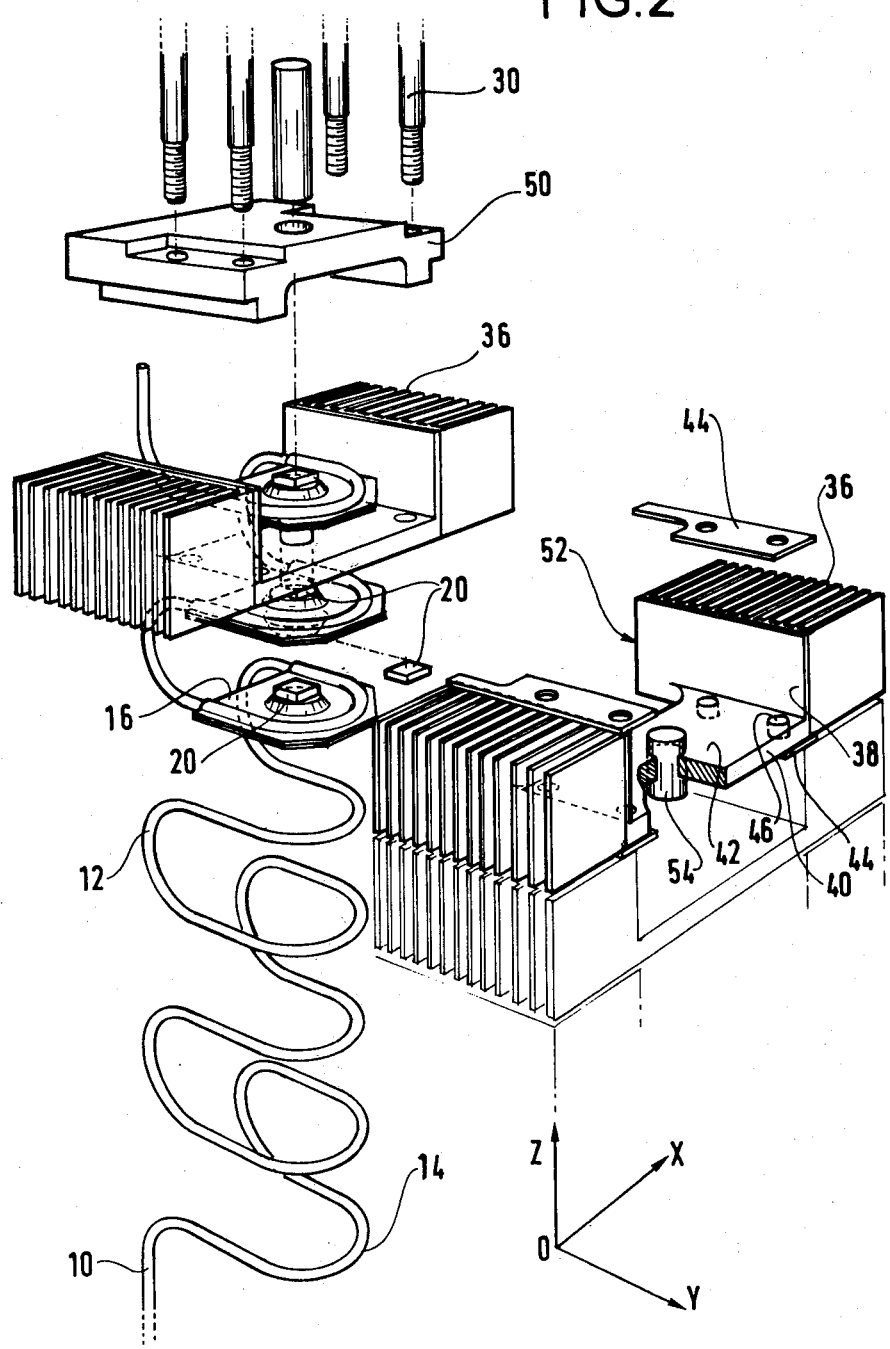
FIG. 2 is an exploded perspective view of part of the heat exchanger assembly of FIG. 1.
Figure 3:
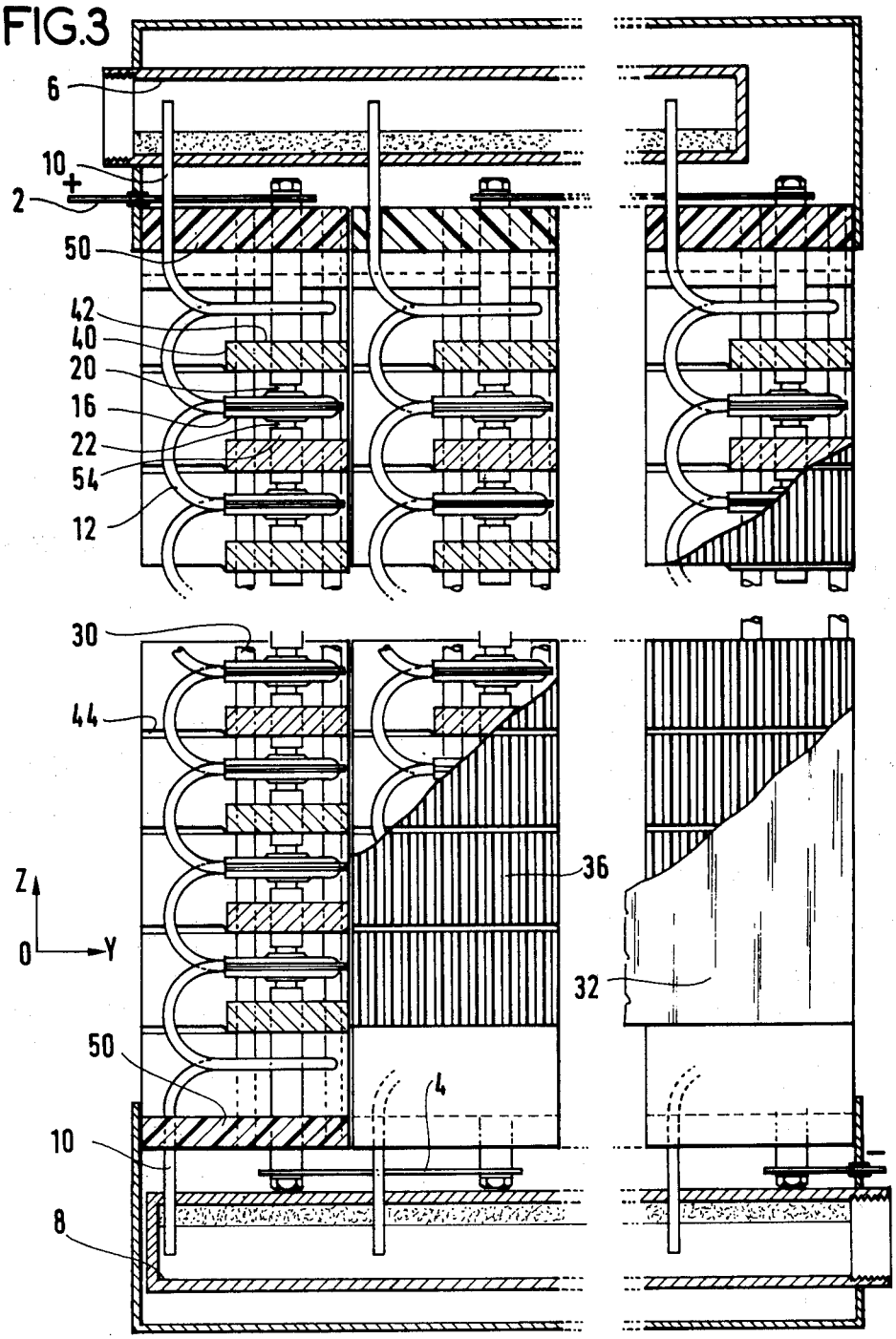
FIG. 3 illustrates the same heat exchanger assembly showing a cross-section through a vertical plane parallel to a horizontal direction OY.

The water circuit includes an inlet manifold 6 through which warm water (at 15° C.) enters and an outlet manifold 8 through which cooled water (at 0° C.) leaves. Both these manifolds are disposed parallel to OY, above and below the row of thermopiles, each of which is fed in parallel between these two manifolds by a pipe such as 10 which passes in series through each of the water conductors of the thermopile. The ends of the pipes 10 where they enter or leave the respective manifolds are sealed to the wall of the manifold by a layer of sealing material on the inside of the manifold and shaded in FIGS. 3 and 4, for example. The lower end of said pipe is situated substantially vertically below its upper end, but between its ends the pipe a complex sinuous form constituted by an alternate succession of connection lengths such as 12 and of heat exchange lengths such as 14 (FIG. 2). Each heat exchange length is disposed in a horizontal plane inside a water type heat conductor. It is curved in such a way as to enter the heat conductor and leave it through the same face of the thermopile in FIG. 1, said face being parallel to the plane XOZ, e.g. the front face. In said horizontal plane, it is U-shaped with arms parallel to the direction OY, one arm being on the right hand side and the other being on the left hand side. To facilitate manufacture thereof, each heat exchange length is substantially semi-circular; if a non-circular form is chosen, it is desirable for its largest transversal dimension to be less than twice its smallest transversal dimension. When the largest transversal dimension is horizontal, the above restriction aims to prevent the pipe from being crushed due to the vertical compression force exerted on the thermopile, as explained further on. When the largest dimension is vertical, the above restriction aims to prevent wasteful increase of the height of the thermopile.

Each connection length is U-shaped in a plane parallel to YOZ, the branches of the U being parallel to OY, one being located thereabove and the other being located therebelow and both forming a continuous pipe with the ends of the heat exchange lengths of two successive water heat conductors in the thermopile. All the heat exchange lengths are superposed. The connection lengths are superposed alternately in two planes parallel to YOZ, one on the right hand side and the other on the left hand side. The heat exchange lengths must have low thermal resistance through their walls. The longitudinal electrical resistance of the connection lengths must be high and in some cases, the connection lengths can be made of an insulating substance such as polyvinyl chloride. However, it has been found preferable to avoid such bonding which entails high labour costs if proper sealing is to be achieved and therefore the pipe assembly must be constituted by a single even tube whose walls are sufficiently thin (less than 0.3 mm) and made of a metal, namely, stainless steel, which has relatively high electrical resistance and mechanically strength. In the example described, the wall thickness is 0.1 mm, the outside diameter being 2.5 mm. It seems difficult at present to reduce the thickness further.

The heat exchanger lengths pass through the water heat conductors such as 16 which have previously been referred to as heat conductors of the second type and which co-operate therewith to consitute water type heat exchangers i.e. these heat conductors which form a part of the thermopile transmit heat directly from the water to the thermoelements of the thermopile. They may be constituted in various known ways, e.g. in the form of solid blocks of copper through which the heat exchanger lengths of the tube 10 pass. However, it is found preferable to constitute them by not very expensive means which make them somewhat resilient in the pile direction. Indeed, this easily enables the thermopile to be kept compressed along its entire length despite small longitudinal movements which are imposed thereto at intervals by a rigid holding structure outside it which undergoes thermal expansion and contraction. Said structure is here constituted by the previously mentioned column formed by the stack of parts 52 held together by the tie rods 30. The advantage of such permanent compression is that it reduces the danger of breakage of the thermoelements and if such breakage occurs, acceptable electric contact is nevertheless maintained where the breakage occurs.

Each water type heat exchanger is constituted by two sheets of copper (or other metal which is a good heat conductor) bonded to each other over a part of their edges and disposed symmetrically on either side of the plane of a heat exchanger length 14 to which they are also bonded, in particular so as to improve thermal contact. The shape of an upper metal sheet 18 is described below by way of example, and the lower metal sheet 19 (FIGS. 5 and 6) is identical thereto.

Firstly, it must be understood that each U-shaped heat exchange length such as 14 forms a semi-circle around the compressed zone of the thermopile in which there are thermoelements such as 20 and 22 in the form of small horizontal square plates which are substantially vertically aligned with the centre of a semi-circle. The metal sheet 18 covers the U-shaped and overlaps therefore to the right and to the left beyond its arms and to the rear beyond its base so that the U-shape is situated entirely within the metal sheet. The metal sheet 18 is stamped so that its portion which overlaps beyond the U-shape will be in contact with the metal sheet 19, in the horizontal centre plane of the heat exchange length 14. These two metal sheets are bonded together in said overlapping portion. The front edges of the metal sheet and the entire zone thereof which is situated between the two arms of the U-shape are neither bonded nor brought close together. The metal sheet 18 is stamped so as to bring it even further away from the metal sheet 19 and to form an upward (outward) central protrusion 24 in the zone where the thermoelement 20 is bonded thereto. Bending the metal sheet at the point where there is a space between the two metal sheets from the central protrusion to the heat exchange length 14 allows the metal sheet to bend and thereby ensures that the heat exchanger is somewhat resilient longitudinally, i.e. resilient is the direction OZ, since the thermoelements 20 and 22 are mechanically connected together by means of the metal sheets 18 and 19 which are connected to each other only along a portion of their edges and the heat exchange length 14.

By way of example, the following dimensions may be given for a water type heat exchanger:

distance between the two arms of the U formed by the heat exchange length 14:23 mm;

radius of the central protrusion 24:4 mm;

thickness of the metal sheets 18 and 19:0.8 mm;

average distance maintained between the thermoelements 20 and 22 (thickness of the heat exchanger):6 mm.

The various bonding operations are preferably performed by brazing.

After assembling the thermopile assembly and the column assembly, by means of the tie rods which act as guides, the cylinders 54 are bonded to the webs 42 and the thermoelements 20, 22 are bonded to the cylinders and to the central protrusions 24 of the water type heat exchangers all in a single operation. Then, the column is compressed by tightening nuts 48. The interior space between the walls 34 is filled with an insulating foam which is polymerized in situ and is intended for preventing thermal short circuits.

It must be understood that all the water type heat exchangers are then in a state of elastic longitudinal compression. This state is permanent whatever the operating temperature of the thermopile may be. This results from the conditions created when assembling and before bonding: the solid cylinders 54 can then slide slightly with respect to the plates 42 so as to compensate for difference in height between the various elements subsequent to the manufacturing tolerances and to distribute the longitudinal forces evenly. Further, sufficient pressure is exerted longitudinally on the thermopile assembly to deform the water type heat exchangers by more than the maximum differences due to thermal expansion that may appear subsequently between the thermopile and the column. The pressure force is evidently much smaller than that which is subsequently exerted by tightening the nuts 48 after bonding, with a view to rigidifying the column.

The water-to-air heat pump thus formed can advantageously be used for heating the air of a room in a house from a water circuit. It can be associated with various conventional heating or air-conditioning systems.

Figure 8:
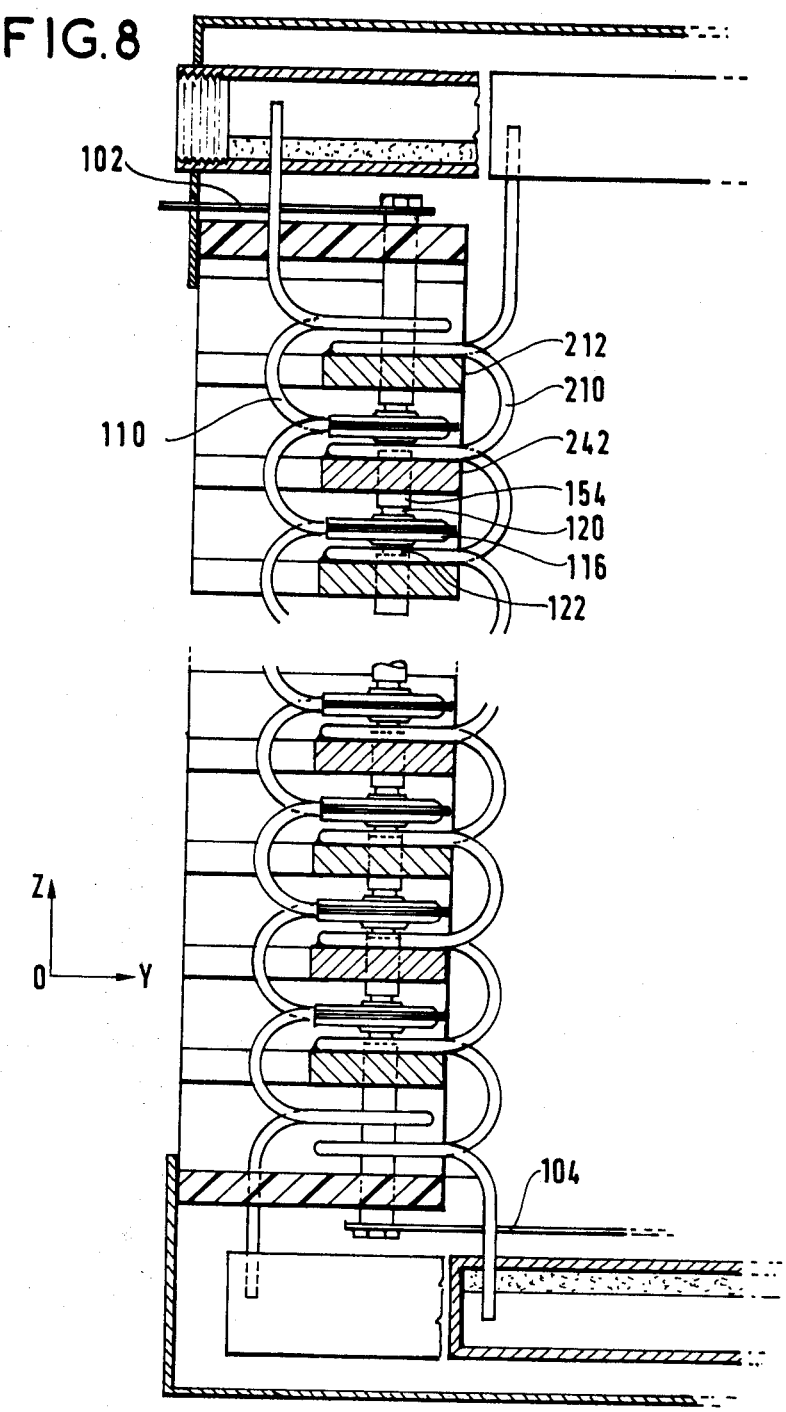
FIGS. 8 and 9 are cross-sections of the heat exchanger assembly of FIG. 7 through two vertical planes respectively parallel to said directions OY and OX.
Figure 9:
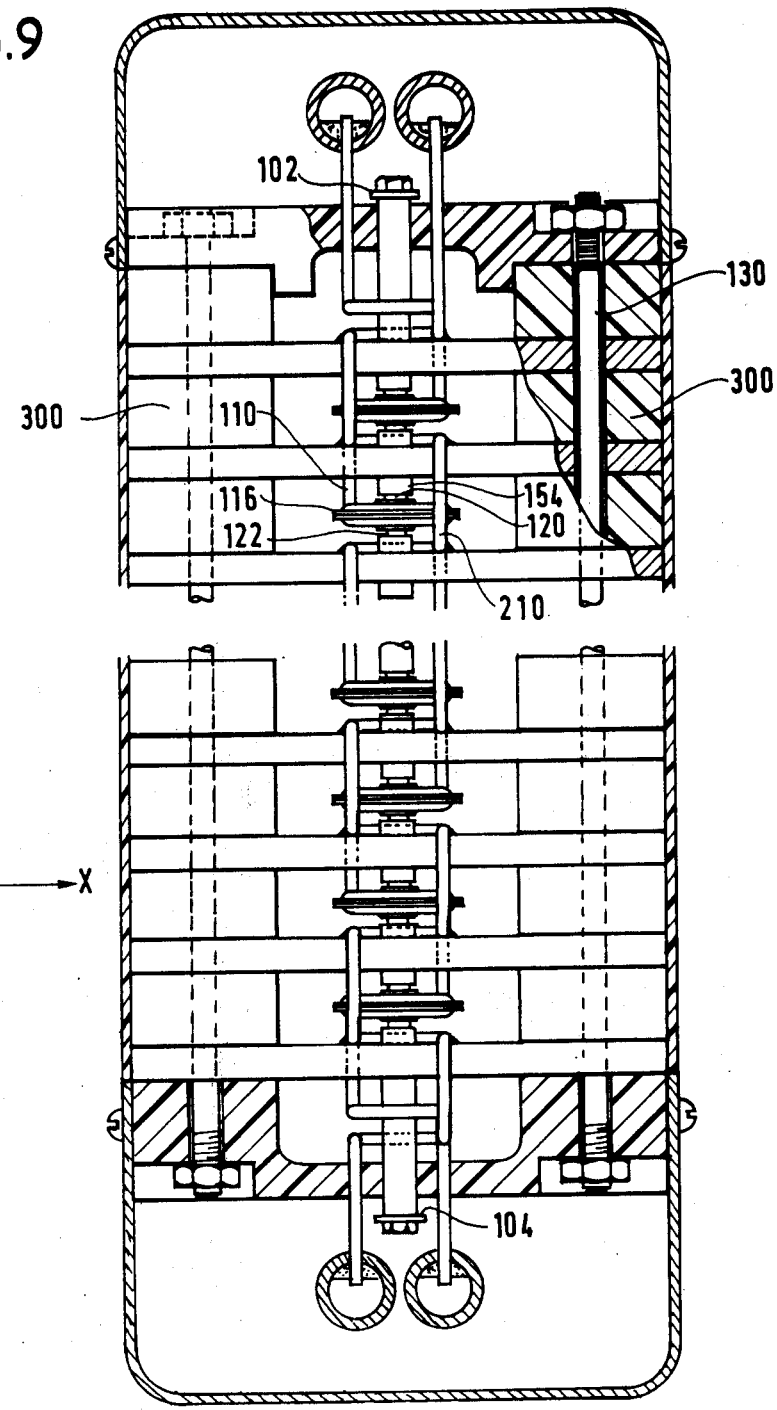

In accordance with a second embodiment of the invention, a water-to-water heat pump can also be constituted as illustrated very schematically in FIGS. 7, 8 and 9. Except where otherwise stated or evident, the details given concerning the components of the first embodiment and their disposition apply to the corresponding components of the second embodiment which bear the same reference numerals with 100 added thereto.

The pump is constituted mainly by a vertical thermopile (direction OZ) electrically fed by means of terminals such as 102 and 104 (FIG. 8). Each stage of the thermopile includes a heat conductor such as 154 of a first type which is, for example, hot, a P type thermoelement such as 120, a heat conductor such as 116 of a second type which is, for example, cold and an N type thermoelement such as 122. Each heat conductor is a part of a heat exchanger which, in the case of the cold heat exchanger, is constituted by a heat conductor 116 which co-operates with the tube 110 of the cold circuit and is identical to the heat exchanger 16 which co-operates with the tube 10 in the first embodiment. As for the hot heat exchanger, it includes, besides a conductor 154 which is identical to the conductor 54 in the first embodiment, a plane rectangular plate 242 which co-operates with the conductor 154 in the same way as the plate 42 co-operates with the conductor 54 in the first embodiment. The plate is completely plane and performs two functions: firstly, it transports heat between the heat conductor 154 and a tube 210 which is a part of a hot water circuit (first fluid circuit). Said tube is identical to the tube 110 except that it is turned symmetrically with respect to a plane XOZ and that its height is shifted. The tube 210 is bonded to a plate 242 by its heat exchange lengths so as to provide good thermal contact.

The plate 242 also forms a connection component for connection with the column constituted by stacking such plates and blocks 300 of plastics material 300 which are used as compression components and are disposed to the right and to the left of the heat exchangers 116. The stack formed by these plates and by these blocks is kept compressed by four vertical tie rods such as 130 which pass through the plates and the blocks. The tie rods are identical to the tie rods 30 in the first embodiment. The connections of the two water circuits are analogous to those of the water circuit in the first embodiment.

It is quite evident that other embodiments of the invention are also possible in particular cases. For example, it may be unnecessary to make some of the water type heat exchangers longitudinally resilient if the variations in temperature of the thermopile and of the column always remain low.

We claim:

1. A thermoelectric heat exchanger assembly with a liquid flow circuit, said exchanger assembly including:
   firstly at least one thermopile of electrically non-insulative units which are in good electrical and thermal contact and are superposed in a stack direction OZ, the thermopile being formed by a plurality of stages each of which includes the following four components:
   a thermoelement of a first conductivity type;
   a heat conductor of a first type;
   a thermoelement of a second conductivity type, opposite to the first; and
   a heat conductor of a second type;
   said thermoelectric heat exchanger also including electric connections at both ends of the thermopile to effect electrical current passage through said components in series;
   a first fluid flow circuit for the circulation of a first heat exchange fluid;
   a second fluid flow circuit for the circulation of a second heat exchange fluid, said second fluid being a liquid, said circuit being constituted by a pipe which passes in series through the heat conductors of the second type in the successive stages of the thermopile, the lengths of said pipe which pass through said conductors being heat exchange lengths and being interconnected in series by connection lengths which extend between two successive stages of the thermopile; and
   heat exchangers of a first type and heat exchangers of a second type to change heat between the thermopile and the fluids which circulate in said first circuit and in said second circuit respectively, the heat exchangers of the first type including the heat conductors of the first type, the heat exchangers of the second type being constituted by said heat exchange lengths and the heat conductors of the second type,
   each heat exchange length being curved at each stage of the thermopile so that it enters the heat conductor and leaves it through the same face of a thermopile, and wherein the direction YO in which each heat exchange length leaves the thermopile being substantially opposite to the direction OY in which the heat exchange length enters the thermopile, thereby facilitating assembly of the thermopile.

2. A thermoelectric heat exchanger assembly according to claim 1, wherein each heat exchange length of the second type has a U-shaped section in a plane parallel to a plane XOY which is perpendicular to the direction OZ;
   each connection length has a U-shaped section in a plane parallel to a plane YOZ so as to make the heat exchanger very flexible in the direction OZ at each connection between two successive stages of the thermopile; and wherein
   the arms of these various U-shaped sections are all parallel to the direction OY and are superposed alternately in two planes parallel to the plane YOZ.

3. A thermoelectric heat exchanger assembly according to claim 2, wherein the heat exchange lengths are constituted by a metal tube formed so that its largest transversal dimension is smaller than twice its smallest transversal dimension.

4. A thermoelectric heat exchanger assembly according to claim 3, wherein the liquid flow pipe is constituted by a continuous metal tube whose radial thermal resistance is sufficiently low to allow good heat exchange in the heat exchange lengths while its longitudinal electrical resistance is sufficiently high to avoid diverting the electric current from flowing substantially through the thermoelements.

5. A thermoelectric heat exchanger assembly according to claim 4, wherein said metal tube is made of stainless steel, with a wall thickness of less than 0.3 mm.

6. A thermoelectric heat exchanger assembly according to claim 2, wherein in the direction OY, it has a row of said thermopiles, each said connection length connecting two successive stages of the same thermopile.

* * * * *